United States Patent

Frederiksen et al.

[15] 3,701,031

[45] Oct. 24, 1972

[54] COMPLEMENTARY POWER AMPLIFIER

[72] Inventors: Thomas M. Frederiksen, Scottsdale; Ernest L. Long, Tempe, both of Ariz.

[73] Assignee: Motorola, Inc., Franklin Park, Ill.

[22] Filed: Aug. 26, 1970

[21] Appl. No.: 66,924

[52] U.S. Cl. ..........................330/17, 330/13, 330/24

[51] Int. Cl. ..................................................H03f 3/18

[58] Field of Search..........................330/13, 17, 30 D

[56] References Cited

UNITED STATES PATENTS

| | | | |
|---|---|---|---|
| 3,495,182 | 2/1970 | Smith et al. | 330/30 D X |
| 3,426,245 | 2/1969 | Yurasek et al. | 330/17 X |
| 3,375,455 | 3/1968 | Motta | 330/17 X |
| 3,441,864 | 4/1969 | Hafler | 330/13 X |
| 3,501,712 | 3/1970 | Webb | 330/17 X |

*Primary Examiner*—Roy Lake
*Assistant Examiner*—Lawrence J. Dahl
*Attorney*—Mueller & Aichele

[57] ABSTRACT

An integrated power amplifier circuit providing high current gain and substantially unity voltage gain for operating as a current boost amplifier includes temperature stabilized current sources operated from a stabilized voltage supply to cause the operation of the amplifier to be independent of supply voltage and temperature variations. In addition, protection against reverse current flow and output current limiting of the output stage is provided.

27 Claims, 1 Drawing Figure

PATENTED OCT 24 1972 3,701,031
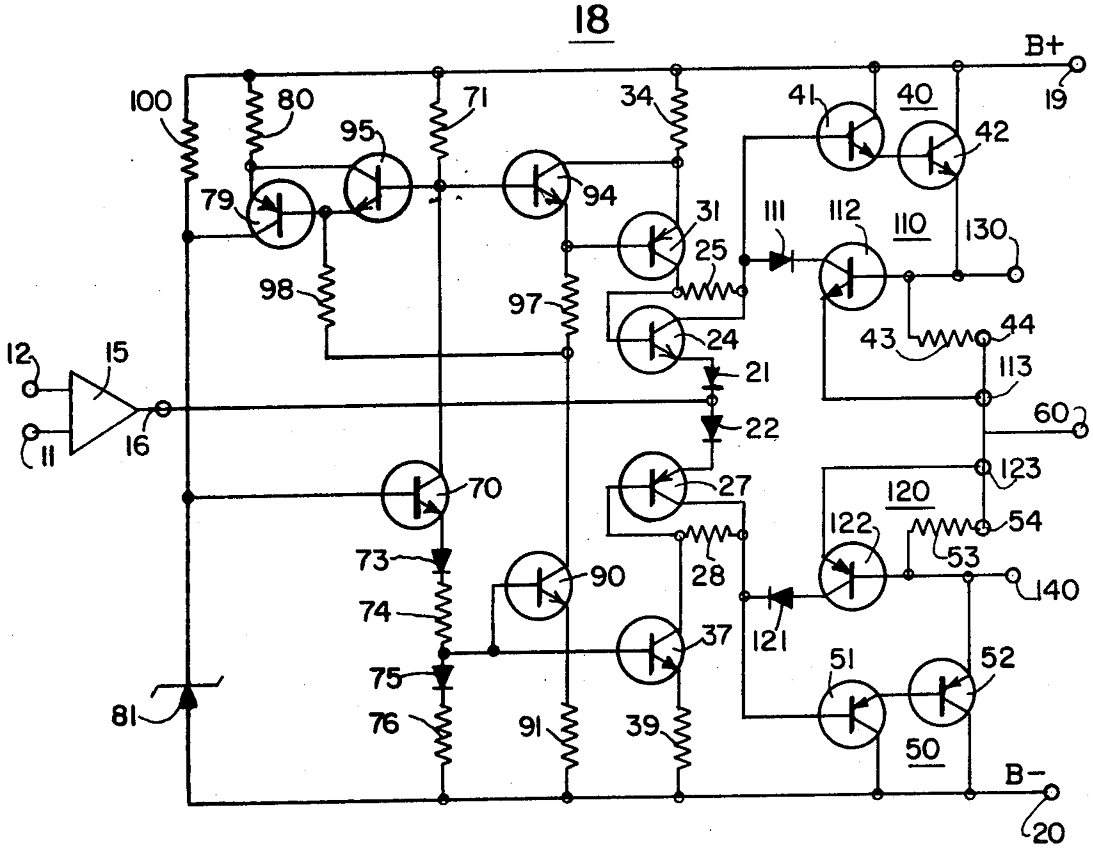
Inventors
THOMAS M. FREDERIKSEN
ERNEST L. LONG
By *Mueller & Aichele* Attys.

COMPLEMENTARY POWER AMPLIFIER

BACKGROUND OF THE INVENTION

Integrated circuit operational amplifiers have found widespread use in a large number of applications but currently available operational amplifier circuits are only capable of delivering a relatively small magnitude of current (on the order of ±10 mils). As a consequence, such operational amplifiers are unsuitable for directly driving loads which require high currents. Generally it has been the practice to provide a complementary amplifier stage consisting of a pair of opposite conductivity discrete transistors driven by the operational amplifier for delivering the required high currents in situations where the load necessitates high current gain in addition to the high voltage gain provided by the operational amplifier. A disadvantage in such a circuit, aside from the fact that it requires additional components which must be interconnected with the operational amplifier, is that the output stage in addition to providing the desired current gain, also provides a voltage off-set between the output of the differential amplifier and the output of the additional transistor stage. Further, in a simple stage there is no load current limiting of protection against reverse current flow.

In order to minimize the effect of the voltage offset, which results from such a circuit, an emitter follower quad circuit has been provided in the form of a pair of cascaded complementary stages, with the input stage including a PNP and an NPN transistor operating as an emitter follower to drive an output stage consisting of an NPN and PNP emitter follower, respectively, so that the voltage offset is reduced. Such a circuit adds considerably to the complexity and requires that the base-emitter junction voltages all match each other, but the circuit still is without fault protection circuitry.

SUMMARY OF THE INVENTION

Accordingly, it is an object of this invention to provide an improved current amplifier.

It is an additional object of this invention to amplify the current provided from the output of an operational amplifier with a minimum voltage offset.

It is a further object of this invention to provide a current amplifier in a form suitable for adaptation as an integrated circuit.

It is another object of this invention to provide a current amplifier which is temperature compensated and substantially independent of variations in operating DC potential.

It is yet another object of this invention to provide an overvoltage protection circuit for a current amplifier.

It is still another additional object of this invention to provide a protection circuit for isolating the input and output terminals of a current amplifier.

In accordance with a preferred embodiment of this invention, a power amplifier includes first and second opposite polarity sources of operating potential with an input stage including a first current source a plurality of diodes and a second current source connected in series together between the first and second sources of operating potential to provide a predetermined current flow through the series connected diodes with the amplifier in a quiescent state of operation. Input signals are applied to an input terminal located between central ones of the diodes, and an output stage in the form of a complementary amplifier including first and second transistors of opposite conductivity types is supplied with a biasing potential from the input stage. The output stage is formed by connecting the collector-emitter paths of the first and second transistors in a series circuit between the sources of operating potential, with a junction between the collector-emitter paths thereof constituting an output terminal for the amplifier.

A current limiting transistor may be coupled with each of the first and second output transistors to limit the amount of current flowing therethrough in response to prevent overloading of the amplifier. A high inverse voltage rated diode formed as part of the integrated circuit from a lateral PNP transistor also may be connected in series with the current limiting circuit to prevent reverse voltages from being applied from the output terminal to the input terminal of the amplifier. Additional means also are provided for utilizing several current sources referenced to a single temperature compensated master current source, so that the operation of the amplifier is substantially independent of variations in temperature and operating voltage.

BRIEF DESCRIPTION OF THE DRAWING

The sole FIGURE of the drawing is a schematic diagram of a preferred embodiment of the invention.

DETAILED DESCRIPTION

Referring now to the drawing there is shown illustrated in block form a typical operational amplifier 15 including inverting and non-inverting inputs 11 and 12 and an output 16 providing the desired amplified output voltage at approximately ± 9 or 10 mils. In order to utilize this output to drive a small load impedance or to drive a capacitive load, with reduced phase shift compared with the normal phase shift experienced with the operational amplifier, and to provide high current gain, an additional integrated circuit power amplifier stage 18 is provided.

The integrated circuit power amplifier 18 is fabricated on a substrate and is supplied with a source of positive potential B+ at an input bonding pad 19 and with a negative supply potential B— at a bonding pad 20. The input stage for the power amplifier circuit includes first and second lateral PNP transistor diodes 21 and 22 connected in series, with the junction between the diodes 21 and 22 being connected to the output terminal 16 of the operational amplifier 15. The diodes 21 and 22 are formed as lateral PNP transistor diodes in order to provide a high inverse voltage rating of the order of 60 or 70 volts, while having a relatively low forward voltage drop of the order of 0.7 volts.

Connected in series with the diode 21 is an NPN transistor diode 24 consisting essentially of a shorted collector-base configuration, with the exception that an impedance 25 is coupled between the base and collector electrodes of the transistor 24. Similarly connected in series with the diode 22 is a PNP transistor diode 27 having the base connected to the collector through a resistor 28. Operating current for the diode string 21, 22, 24 and 27 is provided by a first current source using a lateral PNP transistor 31, the emitter of which is connected through a voltage dropping resistor 34 to the bonding pad 19 and the collector of which is connected to the junction of the resistor 25 and the base of the transistor diode 24.

Similarly, an NPN current source transistor 37 is provided for the negative half of the input stage; and the collector of the transistor 37 is connected to the junction the resistor 28 and the base of the transistor 27, with the emitter of the transistor 37 being connected through a voltage dropping resistor 39 to the bonding pad 20. The current source transistors 31 and 37 are adjusted to supply the same operating current, so that the net current flowing from the bonding pad 19 through the transistor diodes 24 and 21 is the same as the current flowing through the transistor diodes 22 and 27 and the current source 37 to the bonding pad 20. This may be considered to be part of the quiescent operating current for the amplifier in the absence of any input signals on the output terminal of the operational amplifier 15.

The output stage for the current amplifier is in the form of a complementary amplifier including an NPN Darlington amplifier stage 40 including an input NPN transistor 41 and an output NPN transistor 42, with the collectors of the transistors 41 and 42 being coupled to the bonding pad 19 and with the emitter of the transistor 42 being coupled through a resistor 43 to an output terminal bonding pad 44 constituting the positive output for the power amplifier 18.

Similarly, the negative output for the power amplifier is provided by a PNP Darlington stage 50 formed by a lateral PNP transistor 51 and a discrete power PNP transistor chip 52, the collectors of which are connected to the bonding pad 20, with the emitter of the output transistor 52 being connected through a resistor 53 to a negative output terminal 54. For most applications the output terminals 44 and 54 are connected together to form a single common output terminal.

In order to provide a proper operating bias for the Darlington pairs 40 and 50, the DC operating biases for the Darlington pairs 40 and 50 are obtained by coupling the base of the transistor 41 to the junction of the collector of the transistor diode 24 and the resistor 25 and by similarly connecting the base of the transistor 51 to the junction of the collector of the transistor diode 27 and the resistor 28. From an examination of the circuit thus connected, it is apparent that the voltage drop from the collector of the current source transistor 31 to the collector of the current source transistor 37 constituting the current source for the negative half of the amplifier, is equivalent to the voltage drop across 4 base-emitter diode junctions, constituting the base-emitter junctions of the transistor diodes 24 and 27 and the similar junctions of the PNP lateral transistor diodes 21 and 22. As a result of the resistors 25 and 28, the voltage drop or potential difference between the points of connection of the bases of the transistors 41 and 51 is less than the voltage drop caused by the current flowing through the 4 diode drops provided by the transistor diodes 24, 21, 22 and 27. The amount of potential thus provided depends upon the magnitude of the current flowing through the input transistor diode stage between the sources of potential applied to the bonding pads 19 and 20 and may be adjusted by varying the values of the resistors 25 and 28.

The amount of biasing potential applied to the bases of the transistors 41 and 51 is selected to slightly forward bias the transistors 41, 42 and 52, 51 into forward conduction, so that these transistors are operated with a class A quiescent bias and are always conducting. It should be noted that in the series circuit between the base of the transistor 41 and the base of the transistor 51, there are 4 base-emitter diode junctions corresponding substantially to the four base-emitter diode junctions between the collector of the transistor 31 and the collector of the transistor 37. This quiescent bias insures that the Darlington output transistors 42 and 52 are always rendered conductive, with the relative conductivity varying in accordance with input signals applied to the junction of the diodes 21 and 22 from the output of the operational amplifier at the terminal 16.

If the circuit is perfectly balanced, no voltage offset occurs between the signals on the output 16 and those appearing at the output terminal 60 of the power amplifier 18. In the event that there is some voltage offset this offset can be compensated by reducing the value of the resistor 25 and increasing the value of the resistor 28 in the same amount to correct for an offset in one direction or by reducing the value of the resistor 28 and increasing the value of the resistor 25 by the same amount in order to correct for an offset in the other direction. If desired, this adjustment could be provided by locating the resistors 25 and 28 off the integrated circuit chip, with the connections to the bases of the transistors 41 and 51, respectively, being obtained from these resistors in the form of ganged potentiometer taps, moved together in the same direction. Adjustment in the same manner also could be used to create a voltage offset if for some reason such an offset were desired.

By supplying the input diodes 24, 21, 22 and 27 through the current sources 31 and 37, substantial variations in the values of the supply potentials applied to the input bonding pads 19 and 20 may take place without affecting the operation of the circuit. Within the limitations of the constant current transistors 31 and 37, variations in the supply voltage have no affect on the current flowing through the input transistor diodes 24, 21, 22 and 27. Input signals then applied to the junction of the diodes 21 and 22 cause current to flow into or out of the terminal 16 and correspondingly result in a significantly amplified current flowing into or out of the output terminal 60.

The circuit configuration provided permits this high current amplification (on the order of a current gain of 3,000) with a unity voltage gain. The circuit also exhibits a high input impedance and a low output impedance (0.4 megohms for the input impedance and 10 ohms for the output impedance which is a highly desirable characteristic for many circuit applications.

To cause the circuit operation to be relatively independent of variations with temperature as well as independent of variations in the supply voltage, the current source transistors 37 and 31 are referenced from a single current source in the form of an NPN transistor 70, having the collector connected through a voltage dropping resistor 71 to the bonding pad 19 and the emitter connected through a series circuit consisting of a diode 73, resistor 74, a second diode 75, and a second resistor 76 to the bonding pad 20.

A stabilized source of operating potential for the master current source transistor 70 is provided by a lateral PNP current source transistor 79, supplying current from the bonding pad 19 through a resistor 80 to a Zener diode 81, coupled between the collector of the transistor 79 and the bonding pad 20. The base of the transistor 70 is connected between the junction of the cathode of the Zener diode 81 and the collector of the PNP current source transistor 79, with the potential drop across the Zener diode 81 constituting a constant reference voltage for driving the current source transistor 70.

The base-emitter junction of the transistor 70 and the diodes 73 and 75 all have negative temperature coefficient; and the temperature coefficients of the diode formed by the base-emitter junction of the transistor 70 and the diodes 73 and 75 are chosen to offset the temperature coefficient of the Zener diode 81; so that the current flowing through the current source transistor 70 has a zero temperature coefficient. The potential drop caused by this current flowing through the diode 75 and the resistor 76 is applied to the base of the NPN current source transistor 37, the emitter of which, as stated previously, is coupled to the negative bonding pad terminal 20 through a resistor 39. The diode drop across the base-emitter junction of the transistor 37 is equivalent to the diode drop across the diode 75; and if the resistors 76 and 39 are of the same value, the current drawn by the current source transistor 37 also has a zero temperature coefficient since it is referenced to the current drawn by the current source transistor 70.

Similarly, a reference current source NPN transistor 90 is connected to the junction of the resistor 74 and the diode 75 and a resistor 91 is connected between the emitter of the transistor 90 and the negative terminal bonding pad 20. If the resistors 91 and 76 are of the same value, the current drawn by the current source transistor 90 also has a zero temperature coefficient.

Because of the push-pull nature of the amplifier circuit 18, it is necessary to use PNP current sources 31 and 79 to conduct current from the source of positive potential 19 through the input diode string and zener diode 81, respectively. To form these PNP transistors on a integrated circuit as lateral PNP transistors results in transistors having a relatively low and unpredictable beta (of the order of 3 to 30). As a consequence, it would be difficult to provide uniformity from chip to chip in circuits fabricated with such lateral PNP current source transistors 31 and 79, if the bases of the transistors 31 and 79 were connected to a source of reference potential in a manner similar to the connections utilized to provide operating potentials for the current source transistors 90 and 37, for example.

In order to compensate for this shortcoming of the lateral PNP transistors used as current sources, a pair of NPN compensating transistors 94 and 95 are connected with the collector-emitter electrodes thereof coupled across the emitter-base electrodes, respectively, of the transistors 31 and 79. The bases of the transistors 94 and 95 are connected to the junction between the resistor 71 and the collector of the master current source transistor 70. The current flowing through the resistor 71 is a fixed, zero-temperature coefficient, stable current; so that the voltage drop across the resistor 71 is known. This voltage then undergoes a one diode voltage drop from the base-emitter junction of the transistors 94 or 95 and then goes up a diode voltage drop across the base-emitter junction of the lateral PNP transistors 31 and 79, so that the potential appearing at the junction of the emitter of the transistors 31 and 79 with the resistors 34 and 80, respectively, must be approximately the same as the potential appearing at the junction of the collector of the transistor 70 and the resistor 71.

As a consequence, the current flowing through the resistors 34 and 80 is determined by the value of the resistors 34 and 80 relative to the value of the resistor 71. For example, if the values of the resistors 34 and 80 are the same as the value of the resistor 71, the same current must flow through the resistors 34 and 80 as flows through the resistor 71 established by the constant current source transistor 70. The constant current source transistor 90 is coupled through resistors 97 and 98 to the emitters of the transistors 94 and 95, respectively; so that the current flowing out of the collector of the transistors 31 and 79 is equal to the current flowing through the resistors 34 and 80 less the current flowing through the corresponding resistors 97 and 98 and the current source transistor 90, since very little base current flows into the transistors 94 and 95. As a consequence, highly regulated current sources are obtained by the use of the cascade arrangement of the NPN transistors 94 and 95 with the corresponding lateral PNP transistors 31 and 79.

From the foregoing it may be noted that only a single temperature compensated current source 70 is utilized as a master current source for providing a zero temperature coefficient reference for all of the current source transistors 37, 31, 90 and 79. The use of the temperature compensated current sources results in a circuit which is highly stable over a wide range of temperature variations and over a relatively wide range of operating potentials applied to the bonding pads 19 and 20.

It also should be noted that the Zener diode 81 is driven by a current source transistor 79, which in turn is referenced from the potential across the Zener diode 81 controlling the operation of the master current source transistor 70. Because of this interconnection of the current sources and interdependence of the current source 79 and the Zener diode 81 it is possible that upon the initial application of operating potential to the circuit, the circuit would not start up or operate due to a failure of current to flow through the Zener diode 81. To insure that the circuit operates, a resistor 100 of relatively high value is connected across the current source transistor 79 to provide a small leakage current from the positive input bonding pad 19 through the Zener diode 81 to the negative input bonding pad terminal 20. Sufficient current initially flows through this resistor 100 and the Zener diode 81 to initiate operation of the circuit, with the ultimate control of the supply of current to the Zener diode 81 being effected by the operation of the current source transistor 79, once start-up has been completed. The high dynamic impedance of the current source transistor 79 then substantially swamps out any variations in the Zener voltage due to the impedance of the Zener diode 81, so that a highly stable voltage reference is obtained.

Although the circuit which has been described up to this point provides for the desired characteristics of stable, balanced operation, it is additionally desirable to provide protection of the circuit for input and output overvoltage conditions and to isolate the input from the output in the event that overvoltage or short circuits occur either at the input or the output. Input overvoltage protection to isolate the input terminal 16 from the output terminal 60 is provided by the high peak inverse voltage rated lateral PNP translator diodes 21 and 22 which operate to block, respectively, high positive or high negative potentials appearing at the terminal 16 of the operational amplifier 15 and to prevent these potentials from being applied to the Darlington output stages 40 and 50 such as, for example, with output 16 shorted to ground. Similarly, the output stages are provided with a pair of over current regulating circuits 110 and 120, respectively.

The circuit 110 includes a high peak inverse voltage rated lateral PNP transistor diode 111 connected in series with the collector-emitter path of an NPN transistor 112 between the base of the input Darlington transistor 41 and a positive current sense bonding pad 113, which, in the illustrated configuration, is connected in common with the bonding pad 44 to the output terminal 60. The base of the regulating transistor 112 then is coupled to the junction between the emitter of the Darlington output transistor 42 and the resistor 43, with the conductivity of the transistor 112 being dependent upon the voltage drop present across the resistor 43. This voltage drop of course is dependent upon the output current flowing through the Darlington output transistor 42. Thus, the current flowing through the Darlington output transistor 42, the regulating resistor 43 and into a load attached to the output terminal 60 develops a biasing voltage for the transistor 112 which is dependent upon the value of this current and the value of the resistor 43. As this current increases to the point at which the transistor 112 is forward biased, current is drawn by the transistor 112 from the base of the input Darlington transistor 41 in proportion to the amount of forward bias (and thus, proportion to the current through resistor 43), thereby starving the base current drive to input transistor 41 of the Darlington stage 40, and substantially reducing the gain or the current amplification provided by the positive half of the amplifier circuit. In the event that a high positive inverse voltage is applied to the output terminal 60 in a direction which would otherwise be sufficient to forward bias the base-collector junction of the regulator transistor 112, it is necessary that the diode 111 have a high peak inverse voltage rating. The inverse voltage rating of a standard base-emitter junction diode is only of the order of 7 volts or so and would therefore be insufficient to provide adequate protection. Further, using the collector-base diode of a standard integrated circuit NPN transistor causes a parasitic substrate PNP transistor to simultaneously come into conduction which is undesirable. This is the reason that the diode 111 is a lateral PNP transistor diode.

A similar regulating and overvoltage protection circuit 120 is provided in the negative half of the output amplifier stage and includes a lateral PNP transistor diode 121 and a PNP transistor 122 which operate for the negative half of the output stage of the amplifier in the same manner that the transistor diode 111 and regulating transistor 112 operate for the positive half of the amplifier. The circuit connections for the diode 121 and PNP regulating transistor 122 are comparable to those for the diode 111 and transistor 112, with the operation being such that the regulating transistor 122 provides protection against excessive current being drawn through the output Darlington transistor 52, while the diode 121 provides reverse voltage protection for high negative voltages applied to the output terminal 60.

Thus, the high peak inverse voltage rating diodes 21, 22, 111, and 121 provide isolation between the input and output terminals for the circuit, and the transistors 112 and 122 provide a regulation against excessive current being drawn by the Darlington output stages which otherwise could damage these stages of the amplifier.

A circuit has been built and operated which exhibits a large power bandwidth typically of the order of 1.5 megahertz, which is considerably better than present commercially available operational amplifiers. As a consequence, the bandwidth and slew rate of the power amplifier is limited by the characteristics of the operational amplifier 15 supplying the input signals to it and is not limited by the power amplifier circuit 18.

As stated previously, the circuit exhibits a high input impedance, so that when it is driven by an operational amplifier, the gain of the operational amplifier approaches the unloaded open loop gain. Thus, the internal power dissipation of the operational amplifier 15 will be independent of the output voltage resulting in a reduction in thermal drift. The power amplifier circuit 18 also exhibits a low output impedance, typically in the order of 10 ohms, which permits it to be used to drive a capacitive load with a greatly reduced phase shift compared with an operational amplifier. In addition, the output voltage swing capability is considerably increased when it is used to drive a small load impedance.

In order to vary the current limits of the amplifier, the amplifier may be provided with a predetermined fixed resistance for the resistors 43 and 53 built onto the integrated circuit chip between the bonding pads 44 and 130 and 54 and 140 respectively. This then provides a nominal current range for the amplifier circuit. This range can be increased by connecting an external resistance in parallel with the resistors 43 and 53 across the bonding pads 44–130 and 54–140, respectively, with the particular range of operating current being established by the values elected for the external resistance. Similarly, if a reduction in the current range over which the amplifier is to be operated is desired, a resistance can be connected in series with the resistors 43 and 53 by connecting it between the bonding pads 44 and 113 and 54 and 123, respectively, in place of the short circuiting strap illustrated in the embodiment shown in the drawing. Again the particular range of operation is dependent upon the value of the external resistance which is inserted into the circuit.

The effect of adding external resistance either in series with or in parallel with the resistors 43 and 53 readily may be ascertained when it is noted that increasing the resistance between the bases and emitters of the regulating transistors 112 and 122 causes a greater potential difference to exist between the base and collector electrodes for any given current flowing through the resistance, causing the regulation to take place sooner so that a reduction in the output swing or current range is effected. Similarly, a reduction of the value of the resistance connected between the bases and emitters of the transistors 112, such as by connecting a resistor in parallel with the resistors 43 or 53, causes an increase in the output current range by reducing the potential difference between the base and emitter electrodes of the regulator transistors 112 or 122 for a given current flowing through the Darlington output transistors 42 and 52, respectively.

If external adjustment capabilities of the amplifier are not desired, the bonding pads 44, 113, 123 and 54 all could be combined to provide a single output bonding pad 60, with the bonding pads 130 and 140 being eliminated. By providing the options of altering the circuit by the insertion of different values of impedances between the respective pairs of bonding pads as outlined above, however, the versatility of the circuit is substantially increased. It also should be noted that it is not necessary that the circuit be balanced, and a different value of impedance could be utilized in the positive or upper half of the circuit than is used in the lower half of the circuit if the characteristics which then result would prove to be desirable in any particular application.

I claim:

1. A power amplifier including in combination:
 a first source of operating potential of a first polarity;
 a second source of operating potential of opposite polarity to that of the first source of operating potential;
 a plurality of diode means coupled in series;
 an input junction between adjacent ones of said diode means;
 first active temperature-compensated constant current source means coupled between the first source of operating potential and the plurality of diode means and responsive to a bias potential for supplying a predetermined current from the first source of operating potential to the plurality of diode means;
 second active temperature-compensated constant current source means coupled between the plurality of diode means and the second source of operating potential and responsive to a bias potential for pulling said predetermined current from the diode means to the second source of operating potential, the diode means being poled in the forward conducting direction between the first and second current source means;
 a master current path connected between the first and second sources of operating potential, the master current path including resistance means connected in series with a master current source means for drawing a predetermined current between the first and second sources of operating potential, the resistance means forming a voltage divider, different points on which are coupled with the first and second constant current source means for supplying said bias potentials thereto;
 a complementary output stage including at least first and second transistors of opposite conductivity type, each having base, collector and emitter electrodes, with the collector-emitter paths of the first and second transistors being coupled in series in circuit between the first and second sources of operating potentials;
 means coupling the base electrode of the first transistor with the plurality of the diode means at a first junction of the plurality of diode means with the first current source means;
 means coupling the base electrode of the second transistor with the plurality of diode means at a second junction of the plurality of diode means with the second current source means;
 means for applying input signals to be amplified to the input junction; and
 means coupled with the first and second transistors for obtaining output signals from the power amplifier.

2. The combination according to claim 1 further including means for causing the master current source means to have a substantially zero temperature coefficient.

3. The combination according to claim 1 wherein the plurality of diode means includes at least first and second diodes, each having a high peak inverse voltage rating compared to the forward voltage rating thereof.

4. The combination according to claim 3 wherein the high peak inverse voltage rating diodes are lateral PNP transistor diodes.

5. A power amplifier including in combination:
 a first source of operating potential of a first polarity;
 a second source of operating potential of opposite polarity to that of the first source of operating potential;
 a predetermined number of diode junctions coupled in series;
 an input junction between adjacent ones of said diode junctions;
 first active temperature-compensated constant current source means coupled between the first source of operating potential and the predetermined number of diode junctions for supplying a predetermined current from the first source of operating potential to the predetermined number of diode junctions;
 second active temperature-compensated constant current source means coupled between the predetermined number of diode junctions and the second source of operating potential for pulling said predetermined current from the diode junctions to the second source of operating potential, the diode junctions being poled in the forward conducting direction between the first and second current source means;
 a complementary output stage including at least first and second transistors of opposite conductivity type, each having base, collector and emitter electrodes, with the collector-emitter paths of the first and second transistors being coupled in series in circuit between the first and second sources of operating potentials;
 means coupling the base electrode of the first transistor with the predetermined number of diode junctions at a first junction of the predetermined number of diode junctions with the first current source means;

means for coupling the base electrode of the second transistor with the predetermined number of diode junctions at a second junction of the predetermined number of diode junctions with the second current source means;

the complementary output stage including a plurality of base-emitter transistor junctions equal to said predetermined number between the bases of the first and second transistors, and further including means coupled with the predetermined number of diode junctions for causing the potential between the first and second junctions to be less than the potential across the predetermined number of diode junctions, the potential between the first and second junctions being sufficient to provide a quiescent forward bias for the transistors of the output stage;

means for applying input signals to be amplified to the input junction; and means coupled with the first and second transistors for obtaining output signals from the power amplifier.

6. A power amplifier including in combination:

a first source of operating potential of a first polarity;

a second source of operating potential of opposite polarity to that of the first source of operating potential;

a plurality of diode means coupled in series;

an input junction between adjacent ones of said diode means;

first active temperature-compensated constant current source means coupled between the first source of operating potential and the plurality of diode means for supplying a predetermined current from the first source of operating potential to the plurality of diode means;

second active temperature-compensated constant current source means coupled between the plurality of diode means and the second source of operating potential for pulling said predetermined current from the diode means to the second source of operating potential, the diode means being poled in the forward conducting direction between the first and second current source means;

a complementary output stage including first, second, third and fourth transistors, each having base, emitter and collector electrodes, with the first and third transistors being of one conductivity type and the second and fourth transistors being of an opposite conductivity type, the first and third transistors being connected in a Darlington amplifier configuration, the collector electrodes thereof being coupled with the first source of operating potential, the emitter electrode of the first transistor being coupled with the base electrode of the third transistor and with the emitter electrode of the third transistor being coupled with the emitter electrode of the fourth transistor at an output terminal, the collector electrodes of second and fourth transistors being coupled with the second source of operating potential, and the emitter electrode of the second transistor being coupled with the base electrode of the fourth transistor;

the plurality of diode means including semiconductor diode means equal in number to the number of base-emitter junctions of the first, second, third and fourth transistor means;

means coupling the base electrode of the first transistor with the plurality of the diode means at a first junction of the plurality of diode means with the first current source means;

means for coupling the base electrode of the second transistor with the plurality of diode means at a second junction of the plurality of diode means with the second current source means;

means for applying input signals to be amplified to the input junction; and means coupled with the first and second transistors for obtaining output signals from the power amplifier.

7. The combination according to claim 6 wherein the power amplifier is formed as a single integrated circuit with the first source of operating potential being of positive polarity and the second source of operating potential being of negative polarity, the first and third transistors being NPN transistors and the second and fourth transistors being PNP transistors with the plurality of diode means including four diode means coupled in series to conduct current from the first current source means to the second current source means.

8. The combination according to claim 6 wherein the plurality of diode means includes first, second, third and fourth diode means connected in series between the first and second current source means, with the second and third diode means being coupled together at said input terminal at least one of the first and second diode means and at least one of the third and fourth diode means being lateral PNP transistor diode means having a high peak inverse voltage rating relative to the forward voltage rating thereof.

9. The combination according to claim 8 wherein the first and fourth diode means are transistor diode means formed from transistors having base, collector and emitter electrodes, with resistance means coupled in series between the base and collector electrodes thereof, the connections between the bases and the resistance means of the first and fourth diode means being coupled, respectively, with the first and second current source means, and the connections between the collectors and the resistance means of the first and fourth diode means forming the first and second junctions, respectively.

10. The combination according to claim 1 wherein the first current source means includes a transistor means of one conductivity type having base, collector and emitter electrodes with the collector and emitter electrodes coupled in series circuit between the first source of operating potential and the plurality of diode means, and wherein the second current source means includes a transistor means of an opposite conductivity type to the transistor means of the first current source means and having base, collector and emitter electrodes, with the collector and emitter electrodes thereof coupled in series circuit between the plurality of diodes and the second source of operating potential, and wherein the bases of the first and second current source transistor means are connected to said different points on the voltage divider.

11. The combination according to claim 1 further including means for establishing a substantially constant reference voltage and means for supplying said reference voltage to the master current source means for controlling the current drawn thereby, and means coupled with the master current source means for compensating for temperature-caused variations of the reference voltage means.

12. The combination according to claim 10 further including reference voltage source means having a reference current source means and Zener diode means coupled in series between the first and second sources of operating potential at a junction, and wherein the master current source means includes transistor means having base, collector and emitter electrodes, with the collector and emitter circuits thereof including the voltage divider connected in series therewith, the junction of the reference current source means and the Zener diode means being coupled with the base electrode of the master current source transistor means, the base electrode of the second current source transistor means being coupled with the emitter circuit of the master current source transistor means, and the base electrode of the first current source means and the reference current source means being coupled with the collector circuit of the master current source transistor means.

13. The combination according to claim 12 further including impedance means coupled between the first source of operating potential and the junction of the Zener diode means with the reference current source means for providing a leakage path to insure turn-on of the Zener diode means upon initial application of operating potentials to the circuit.

14. The combination according to claim 12 wherein the power amplifier is formed as an integrated circuit, the reference current source means and the first current source means include lateral PNP transistor means each having base, collector and emitter electrodes, with the collector electrode of the reference transistor means being coupled with the Zener diode means and the emitter electrode thereof being coupled with the first source of operating potential, and further including a further current source means and first and second gain control NPN transistors each having base, collector, and emitter electrodes, with the collector and emitter electrodes of the first and second gain control transistors being coupled with the emitter and base electrodes, respectively, of the first and reference current source transistor means, the base electrodes of the first and second gain control transistors being coupled with the collector circuit of the master current source transistor means and the emitter electrodes thereof being coupled with the further current source means, the further current source means and the base electrode of the second current source transistor means being coupled with the emitter circuit of the master current source transistor means.

15. A power amplifier including in combination:

a first source of operating potential of a first polarity;

a second source of operating potential of opposite polarity to that of the first source of operating potential;

a complementary output stage including at least first and second transistors of opposite conductivity type, each having base, collector, and emitter electrodes, with the collector-emitter paths of the first and second transistors being coupled at an output junction in series circuit between the first and second sources of operating potentials;

means for applying operating bias and input signals to the base electrodes of the first and second transistors; and unidirectional conductive means having a high peak inverse voltage rating compared with the forward voltage rating thereof coupled between the output junction and the base electrodes of the first and second transistors for preventing reverse current flow from the output junction to the input at the bases of the first and second transistors.

16. The combination according to claim 15 further including means responsive to the current flow through the transistors for limiting said current flow to a predetermined magnitude.

17. The combination according to claim 15 wherein the power amplifier is an integrated circuit and wherein the unidirectional conductive means are comprised of first and second lateral PNP transistor diodes.

18. The combination according to claim 17 wherein the first source of operating potential is a source of positive operating potential and the second source of operating potential is a source of negative operating potential, the first transistor is an NPN transistor, the collector of which is coupled with the positive source of operating potential and the base electrode of which is supplied with input signals, and the second transistor is a PNP transistor, the collector of which is coupled with the negative source of operating potential, and the base of which is supplied with input signals, and the emitters of the first and second transistors are coupled with the output junction.

19. The combination according to claim 18 wherein the complementary output stage includes a first Darlington pair having the first NPN transistor cascaded with and driven by a third NPN transistor and a second Darlington pair having the second PNP transistor cascaded with and driven by a fourth PNP transistor with the emitter of the first transistor being coupled through a first impedance means to the output terminal and with the emitter of the second transistor being coupled through a second impedance means to the output terminal, the first and second diodes each having first and second terminal, with the first terminal of the first diode and the second terminals of the second diode being connected, respectively, to the base electrodes of the third and fourth transistors; and further including an NPN control transistor having base, collector and emitter electrodes, with the collector electrode thereof coupled with the second terminal of the first diode, the base electrode thereof coupled to the emitter electrode of the third transistor, and the emitter electrode thereof coupled with the output terminal; and a PNP control transistor having base, collector, and emitter electrodes, with the collector electrode coupled with the first terminal of the second diode, the base electrode thereof coupled to the emitter electrode of the fourth transistor, and the emitter electrode thereof coupled with the output terminal, so that the current drawn from or supplied to the output terminal across the first or second impedance means varies the conductivity of the first and second control transistors accordingly to limit the current flow through the first and second transistors of the first and second Darlington pairs.

20. The combination according to claim 15 further including a plurality of diode means coupled in series circuit between the first and second sources of operating potential;

an input junction between adjacent ones of said diode means; and means for applying input signals to be amplified to the input junction;

wherein the means for applying operating bias and input signals to the base electrodes of the first and second transistors couples the base electrode of the first transistor with the plurality diode means at a first junction on one side of the input junction and couples the base electrode of the second transistor with the diode means at a second junction on the other side of the input junctions.

21. The combination according to claim 20 wherein the plurality of diode means includes at least first and second diodes each having a high peak inverse rating compared to the forward voltage rating thereof, with the first and second diodes being located on opposite sides of the input junction.

22. The combination according to claim 21 wherein the high peak inverse voltage rating diodes are lateral PNP transistor diodes.

23. A power amplifier including in combination:

a first source of operating potential of a first polarity;

a second source of operating potential of opposite polarity to that of the first source of operating potential;

a complementary output stage including at least first and second transistors of opposite conductivity type, each having base, collector, and emitter electrode, with the collector-emitter paths of the first and second transistors being coupled at an output junction in series circuit between the first and second sources of operating potential;

a plurality of transistor diode means coupled in series circuit between the first and second sources of operating potential, each of said diode means formed by interconnecting the base and collector electrodes thereof;

an input junction between adjacent ones of said diode means;

first and second resistor means forming the interconnection between the base and collector electrodes of first and second transistor diode means located respectively on opposite sides of the input junction, the first and second sources of operating potential being coupled with the bases of the first and second transistor diode means, respectively;

first means for applying operating bias and input signals to the base electrode of the first transistor coupling said base electrode thereof with the collector of the first transistor diode means at a first junction; and second means for applying operating bias and input signals to base electrode of the second transistor coupling said base electrode thereof with the collector of the second transistor diode means at a second junction.

24. An integrated circuit current source system including in combination:

a first source of operating potential of a first polarity;

a second source of operating potential of opposite polarity to that of the first source of operating potential;

first utilization means;

first current source means including first transistor means of one conductivity type having base, collector, and emitter electrodes, with the collector and emitter electrodes thereof coupled in series circuit between the first source of operating potential and the first utilization means, respectively;

second utilization means;

second current source means including second transistor means of opposite conductivity type to the first transistor means and having base, collector, and emitter electrodes, with the collector and emitter electrodes thereof coupled in series circuit between the second utilization means and the second source of operating potential, respectively;

first and second impedance means;

master current source means including a master current source transistor means having base, collector, and emitter electrodes, with the collector-emitter path thereof being coupled in series circuit through the first impedance means to the first source of operating potential and being coupled in series circuit through the second impedance means to the second source of operating potential;

means for providing a stabilized bias voltage to the base of the master current source transistor to control the conductivity thereof;

means for coupling the base of the first current source transistor with the first impedance means in the series circuit between the master current source transistor and the first source of operating potential; and means for coupling the base of the second current source transistor with the second impedance means in the series circuit between the master current source transistor and the second source of operating potential.

25. The combination according to claim 24 wherein the means for establishing a stabilized bias voltage on the base of the master current source transistor includes reference current source means and zener diode means coupled in series between the first and second sources of operating potential at a junction, the junction of the reference current source means and zener diode means being coupled with the base electrode of the master current source transistor means, and further including means for temperature compensating the reference voltage means.

26. The combination according to claim 25 wherein the first transistor means and the reference current source means include lateral PNP transistors, with the collector electrode of the reference transistor being coupled with the zener diode means at the junction and the emitter electrode thereof being coupled with the first source of operating potential, and the second transistor means including an NPN transistor; the combination further including a further current source means and first and second gain control NPN transistors, each having base, collector, and emitter electrodes, with the collector and emitter electrodes of the first and second gain control transistors being coupled with the emitter and base electrodes, respectively, of the first and reference current source transistors, the base electrodes of the first and second gain control transistors being coupled with the collector of the master current source transistor, and the emitter electrodes of the gain control transistors being coupled with the further current source means, the further current source means, and the base electrode of the second transistor means being coupled with the emitter of the master current source transistor.

27. The combination according to claim 20 wherein the plurality of diode means includes a plurality of diode junctions, the complementary output stage including a corresponding plurality of diode junctions in the form of base-emitter junctions of the transistors, and further including means coupled with the plurality of diode means for causing the potential between the first and second junctions to be less than the potential across the plurality of diode means.

* * * * *